(12) United States Patent
Hong

(10) Patent No.: US 6,191,981 B1
(45) Date of Patent: Feb. 20, 2001

(54) SENSE AMP CONTROL CIRCUIT

(75) Inventor: Jong Hoon Hong, Inchon-kwangyoksi (KR)

(73) Assignee: Hyundai Electronics Industries Co., Ltd., Kyoungki-do (KR)

( * ) Notice: Under 35 U.S.C. 154(b), the term of this patent shall be extended for 0 days.

(21) Appl. No.: 09/283,575

(22) Filed: Apr. 1, 1999

(30) Foreign Application Priority Data

Aug. 18, 1998 (KR) .................................................. 98/33512

(51) Int. Cl.[7] ...................................................... G11C 7/00
(52) U.S. Cl. .................... 365/189.09; 365/205; 365/207; 365/230.06
(58) Field of Search ................................. 365/205, 207, 365/208, 230.06, 189.09

(56) References Cited

U.S. PATENT DOCUMENTS

| | | | |
|---|---|---|---|
| 4,948,993 | * 8/1990 | Chin et al. | 365/205 |
| 5,053,998 | * 10/1991 | Kannan et al. | 365/208 |
| 5,329,492 | * 7/1994 | Mochizuki | 365/205 |
| 5,422,853 | 6/1995 | Miyamoto | 365/205 |

* cited by examiner

Primary Examiner—Vu A. Le

(57) ABSTRACT

Circuit for controlling a sense amplifier, is disclosed, which restores a signal delayed by line loading for faster operation of the sense amplifier in a case every one or every group of a few of the sense amplifiers is provided with one sense amplifier drive for faster data sensing of the sense amplifier, including signal transmission means for compensating a signal /SP or SN for controlling a drive of a sense amplifier for a path basis transmission delay in addition to a sense amplifier pull-up driver and a sense amplifier pull-down driver for driving sense amplifiers connected to one pair of bit lines B/L, and /BL for a positive, and a negative signals, and a sense amplifier driver precharge circuit for precharging the sense amplifier drivers when the sense amplifier are not in operation.

31 Claims, 8 Drawing Sheets

SENSE AMP CONTROL CIRCUIT

BACKGROUND OF THE INVENTION

1. Field of the Invention

The present invention relates to a circuit for transmitting a control signal for driving a sense amplifier, and more particularly, to a circuit for controlling a sense amplifier which restores a signal that has been delayed by line loading for faster operation of the sense amplifier, where every one or every group of a few sense amplifiers is provided with one sense amplifier driver for faster data sensing of the sense amplifier.

2. Discussion of the Related Art

The sense amplifier detects, amplifies, and forwards as output a level of voltage or current of a received signal which meets a threshold value during a particular time region. The sense amplifier senses data stored in a memory and the like positively, and amplifies and forwards it as output. In general, the sense amplifier must be highly sensitive, fast, and operative in a wide voltage range, and must have a low power consumption and occupy a small area.

A background art sense amplifier will be explained with reference to the attached FIGS. 1–3.

FIG. 1 illustrates a block diagram of a memory, schematically. In FIG. 1, the background art memory is provided with an address generating unit 10 for generating an address and an address transition detecting signal ATD, a pre-decoder 20 for decoding the address generated in the address generating unit 10, a word/bit line decoder 30 for decoding a word line and a bit line in response to a decoded address signal generated in the predecoder 20, a memory cell 40 adapted to be accessed by a word line (WL) driven by the word/bit line decoder 30, a sense amplifier 50 for receiving data accessed in the memory cell 40 through bit line BL to amplify a weak signal, and an output latching unit 60 for latching a signal from the sense amplifier 50 in response to the address transition detecting signal ATD generated in the address generating unit 10.

The operation of the memory device having the aforementioned system will be explained up to the sense amplifier. The address generating unit 10 generates an address transition detecting signal ATD and provides a changed address when an address is changed. Address data from the address generating unit 10 is decoded in the predecoder 20, which enables a word line WL and a bit line BL relating to the decoded address through the word/bit line decoder 30, to select an intended memory cell 40. Then, data received through the enabled bit line BL is amplified in the sense amplifier 50. In this instance, a data sensing rate of the sense amplifier 50 is a major factor for determining an access rate for the memory.

FIG. 2 illustrates a background art circuit for controlling sense amplifiers in a memory. In FIG. 2, the background art circuit for controlling sense amplifiers in a memory is provided with a sense amplifier pull-up driver 51 and a sense amplifier pull-down driver 52 for driving sense amplifiers 50a~50n connected to one pair of bit lines BL and /BL representing positive and negative signals, respectively, and a sense amplifier driver precharge circuit 53 for precharging the sense amplifier drivers when the sense amplifiers are not in operation.

FIG. 3 illustrates waveforms of signals at different parts and peripheral important parts in FIG. 2. The operation between the sense amplifiers having the aforementioned system and the peripheral circuit will be explained with reference to FIG. 3. When an equalization signal EQ of the sense amplifier driver circuit is at low VSS, signals /SP and SN for controlling a sense amplifier driver are received, driving the sense amplifier drivers 51–52. Thus, sense amplifier drivers 51 and 52 generate /SNC and SPC to drive sense amplifiers 50a~50n. When the sense amplifiers 50a~50n are driven by /SNC and SPC of the sense amplifier drivers 51 and 52, the one pair of bit lines of BL and IBL representing a positive signal and a negative signal, respectively, are ready to transmit data.

In this instance, as shown in FIG. 2, when there are a plurality of sense amplifiers 50a~50n provided therein, if a transmission length of signals /SP and SN for controlling driving of the sense amplifiers 50a~50n is long, an accurate signal may not be delivered due to a signal loss caused by the transmission path, i.e., a line loading. Therefore, the background art circuit for controlling a sense amplifier may be susceptible to delays in the operation of the sense amplifier driven by a pull-up or a pull-down operation voltage caused by line loading, which causes major problems for users demanding fast and accurate operation, an ultimately degrades the product.

SUMMARY OF THE INVENTION

The present invention is directed to a circuit for controlling a sense amplifier that substantially obviates one or more of the problems due to limitations and disadvantages of the related art.

An object of the present invention is to provide a circuit for controlling a sense amplifier which can make an operation of a sense amplifier faster, preferably by recovering signal delay due to line loading.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings. It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and which are given by way of example only and thus should not limit the invention, illustrate embodiments of the invention and together with the description serve to explain the principles of the invention.

DETAILED DESCRIPTION OF THE PREFERRED EMBODIMENT

Figure 1:
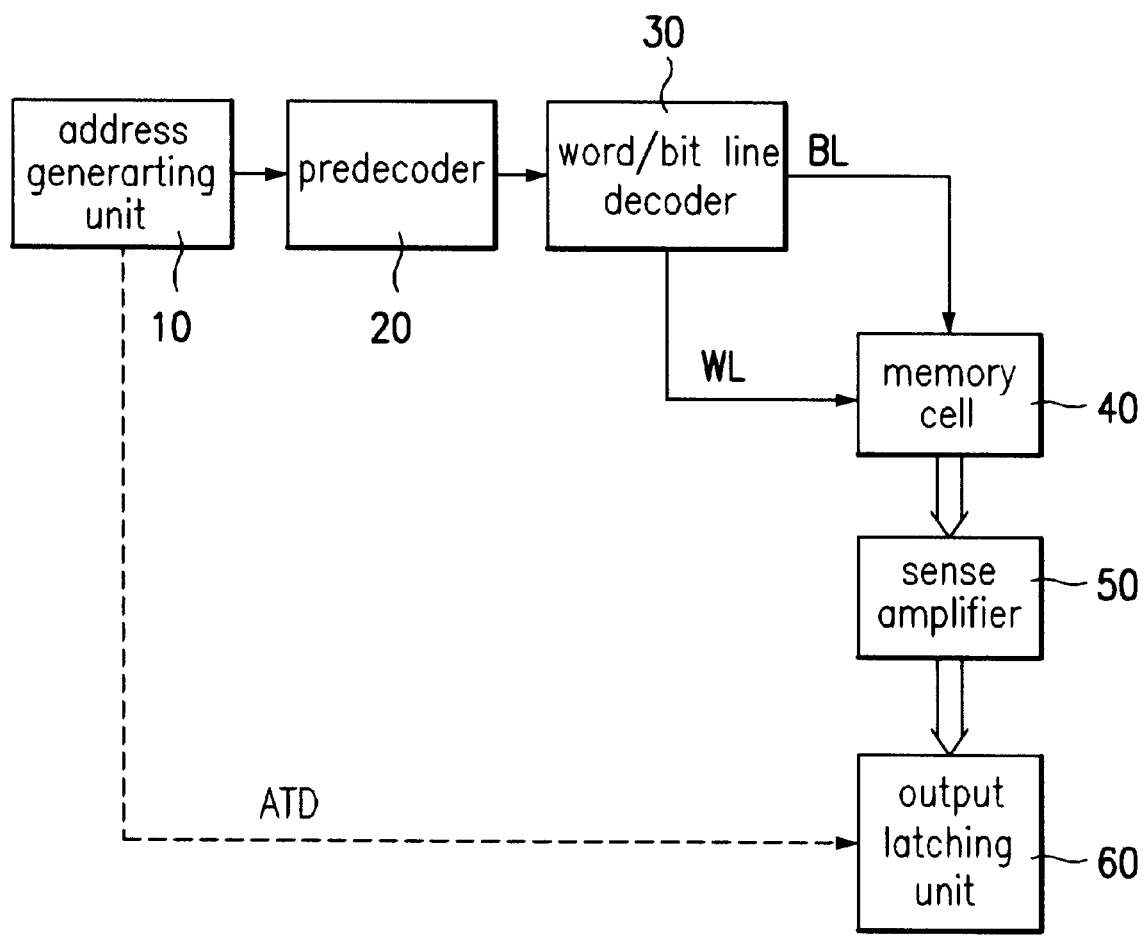
FIG. 1 illustrates a block diagram for explaining a background art system of a memory, schematically.
Figure 2:
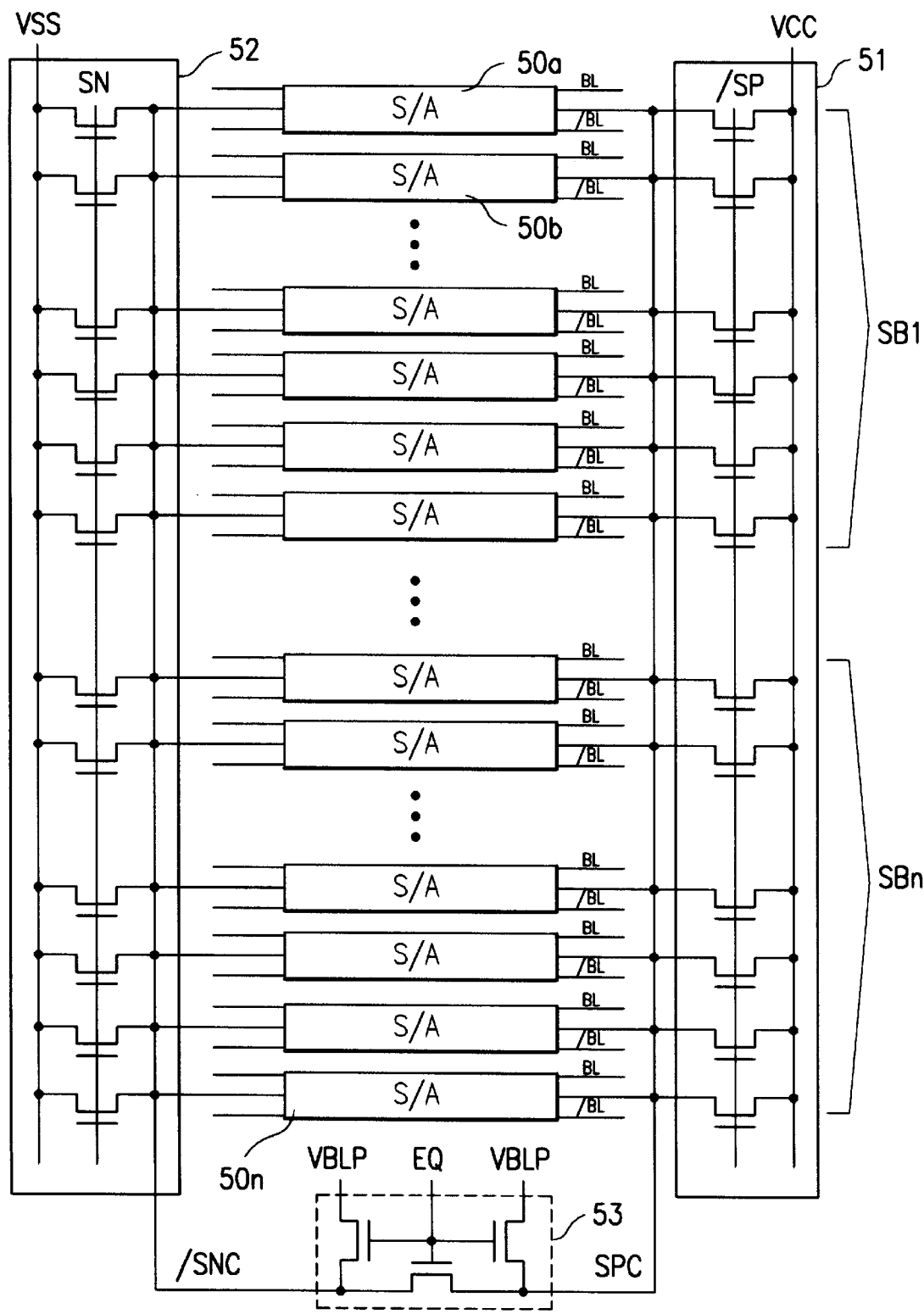
FIG. 2 illustrates a background art circuit for controlling a sense amplifier in a memory.
Figure 3:
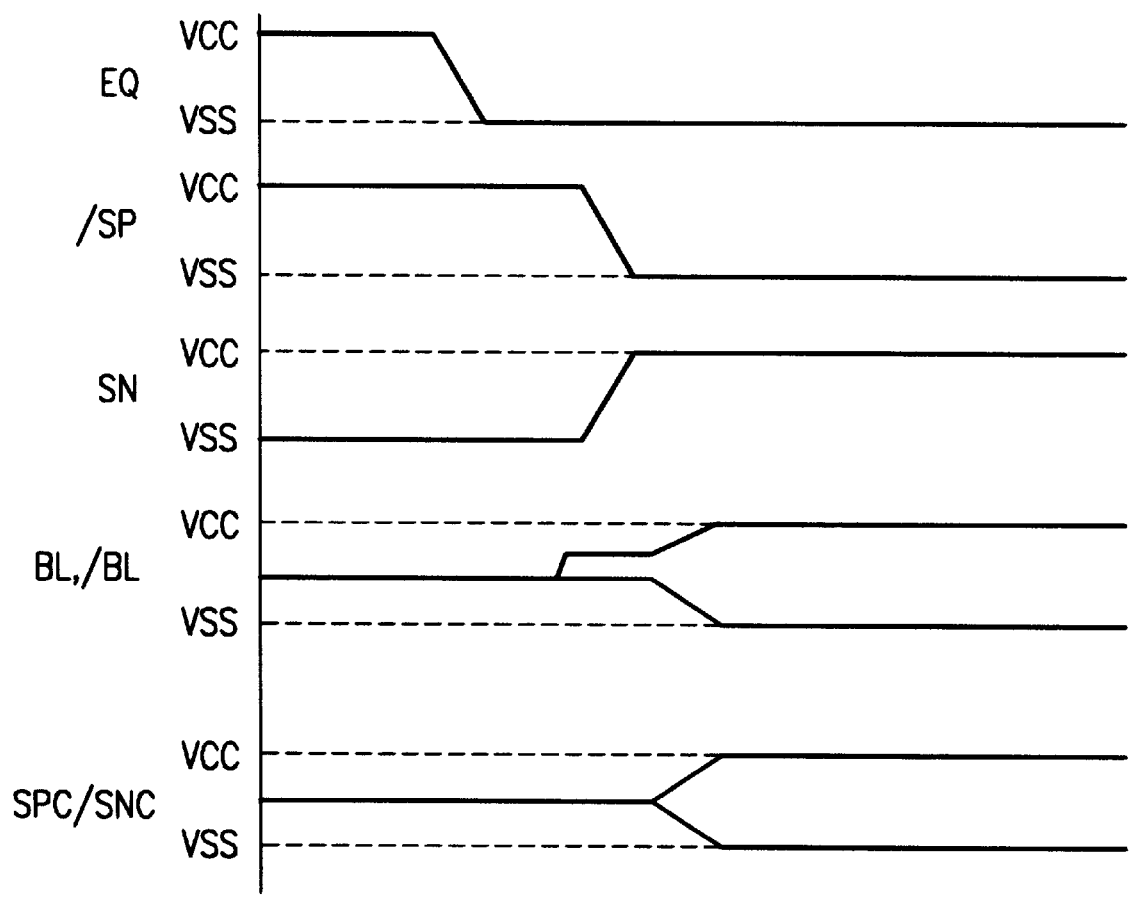
FIG. 3 illustrates waveforms of signals at different parts in FIG. 2 and peripheral important parts.

Reference will now be made in detail to the preferred embodiments of the present invention, examples of which are illustrated in the accompanying drawings. In the drawings, redundant description of like elements and processes, which are designated with like reference numerals, is omitted for brevity.

Figure 4:
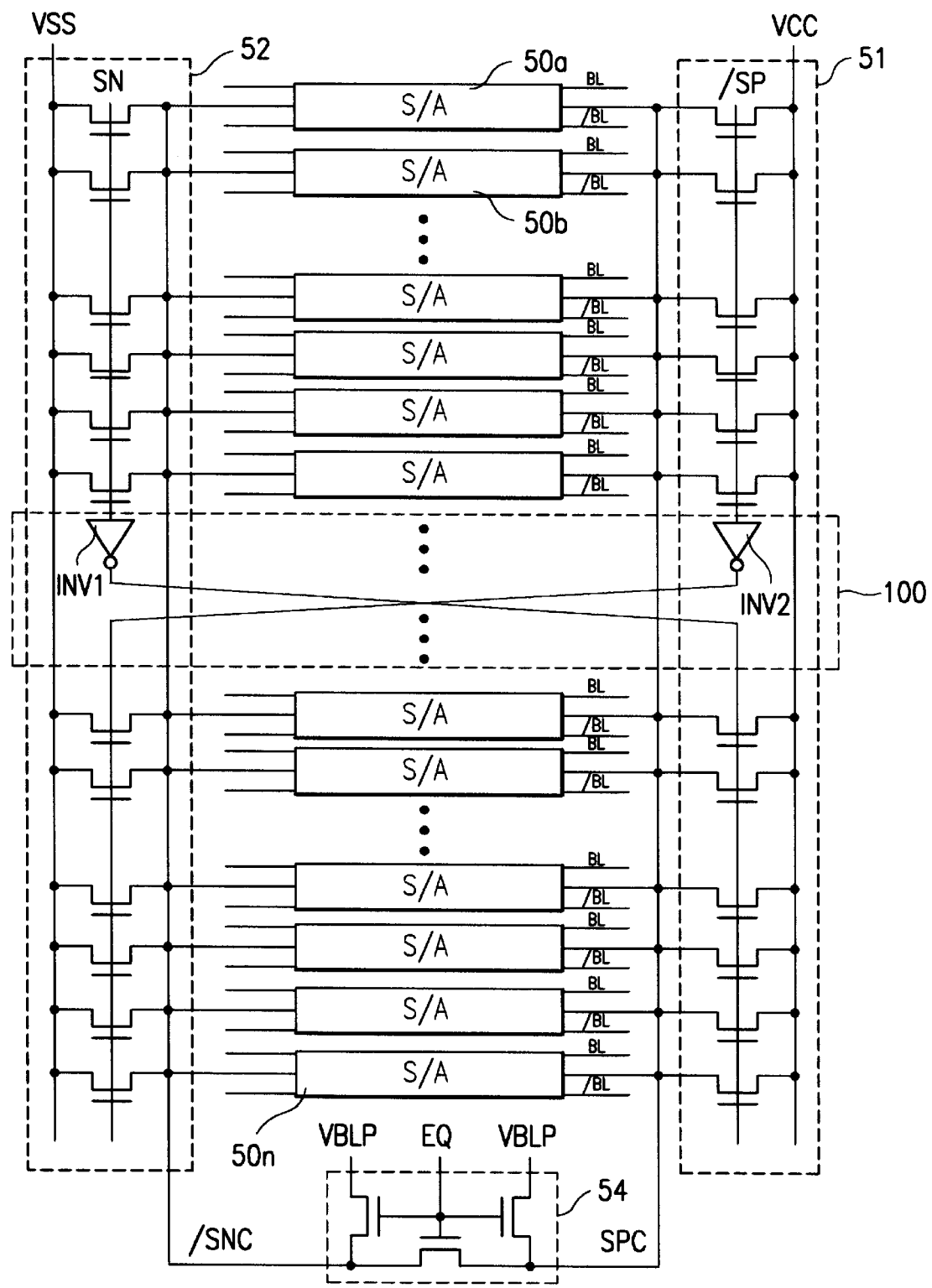
FIG. 4 illustrates a circuit for transmission of a signal for controlling a sense amplifier in accordance with a first embodiment of the present invention.

FIG. 4 illustrates a circuit for transmitting a signal used to control a sense amplifier in accordance with a first embodiment of the present invention. In FIG. 4, a circuit for controlling a sense amplifier in accordance with a first embodiment of the present invention includes sense amplifiers 50a~50n, a signal transmission device 100 for compensating a signal /SP or SN used to control a sense amplifier 50a~50n for a path basis transmission delay, a sense amplifier pull-up driver 51 and a sense amplifier pull-down driver 52 for driving sense amplifiers 50a~50n connected to one pair of bit lines BL and /BL for positive and negative signals, respectively, and a sense amplifier driver precharge circuit 53 for precharging the sense amplifier drivers when the sense amplifiers 50a~50n are not in operation. The signal transmission device 100 may include an inverter. The inverter includes a first amplifying inverter INV1 for receiving a control signal SN for pulling down of the sense amplifier, for inverting the received control signal /SP and for applying the inverted control signal /SP as next stage control signal for pulling up the remaining sense amplifier, and a second amplifying inverter INV2 for receiving a control signal S/P for pulling up the sense amplifier, for inverting the control signal SN, and for applying the inverted control signal SN as a next stage sense signal for pulling down the remaining sense amplifier.

Figure 5:
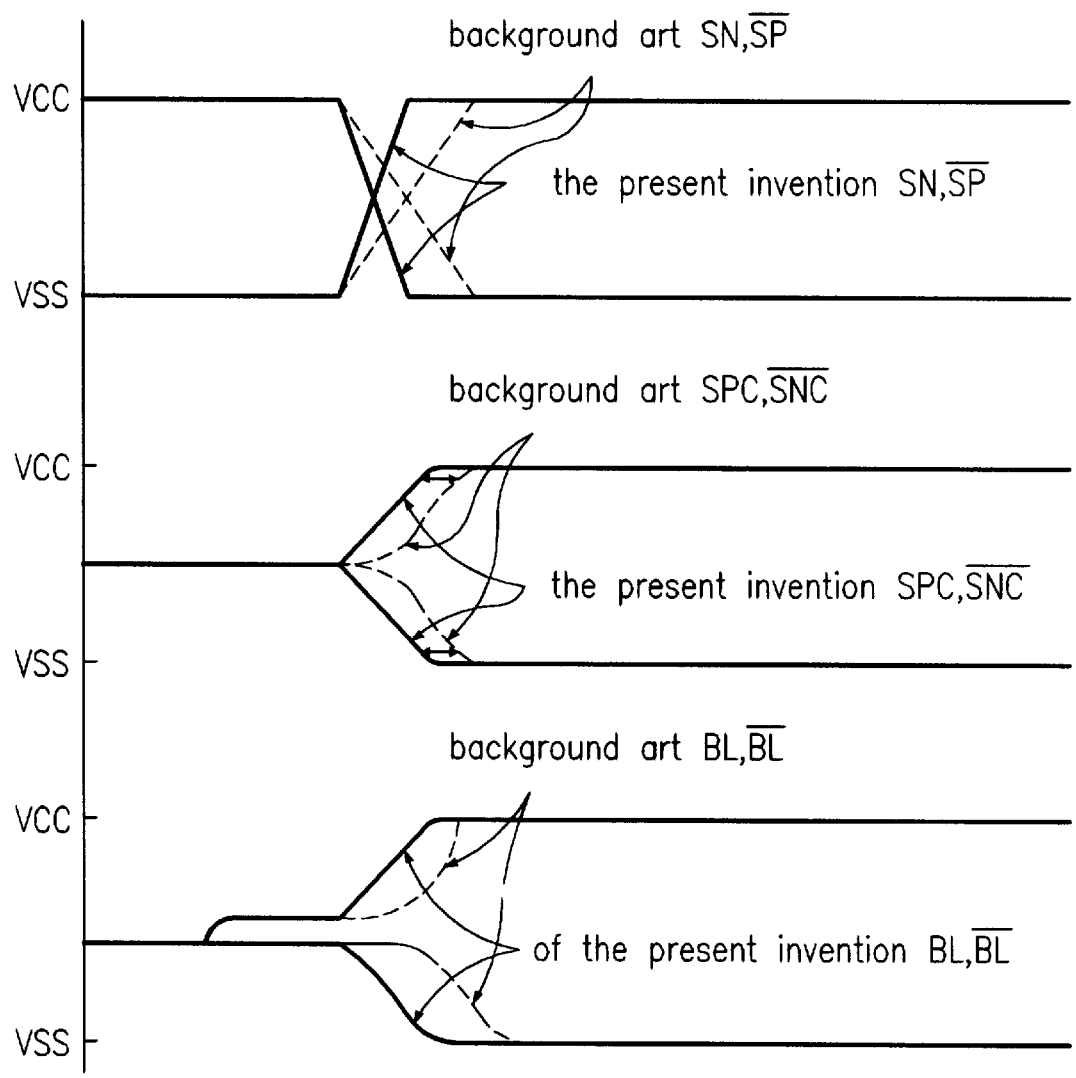
FIG. 5 illustrates waveforms of signals at different parts in FIG. 4 and peripheral important parts.

FIG. 5 illustrates waveforms of signals at different parts in FIG. 4 and peripheral important parts. FIG. 5 will be explained with reference to FIG. 4.

Referring to FIG. 5, in the circuit for transmitting a signal that controls a sense amplifier of the present invention, when an equalization signal EQ of the sense amplifier driver circuit is at a low level VSS, signals /SP and SN for controlling the sense amplifier driver are provided to operate the sense amplifier drivers 51 and 52. Therefore, when the sense amplifiers 50a~50n are driven by the sense amplifier drivers 51 and 52, the one pair of bit lines BL and /BL representing positive and negative signals, respectively, become spaced apart, ready for transmission of data.

The inverters INV1 and INV2 for compensating signal delays are provided at every transmission path section of the signals /SP and SN for controlling the sense amplifiers thereby inverting transmitted signals. Although second amplifying inverter INV2 is adapted to receive the control signal /SP for pulling up the sense amplifier and first amplifying inverter INV1 is adapted to receive the control signal SN for pulling down the sense amplifier, an output terminal of the second amplifying inverter INV2 is connected to a control signal SN for pulling down of the sense amplifier. Similarly, an output terminal of the first amplifying inverter INV1 is connected to the control signal /SP for pulling up the sense amplifier. Because inverters of delayed signals typically have voltage levels ranging from a VCC voltage level and a VSS voltage level in which a relatively low signal is provided for a VCC voltage level and a relatively high signal is provided for a VSS voltage level, compensation of the delayed signals can be achieved. And, since the control signal /SP for pulling up the sense amplifier and the control signal SN for pulling down the sense amplifier have opposite voltage levels, as explained before, the first amplifying inverter INV1 that receives the control signal SN for pulling down the sense amplifier has an output terminal that is connected to the control signal /SP for pulling up the sense amplifier, and the second amplifying inverter INV2 that receives the control signal /SP for pulling up the sense amplifier has an output terminal that is connected to the control signal SN for pulling down the sense amplifier. In conclusion, the signals /SNC and SPC provided from the sense amplifier drivers are able to achieve a desired voltage level faster. Accordingly, by restoring (e.g., boosting) signals otherwise delayed by line loading, overall operation of the sense amplifiers can be made faster.

Figure 6:
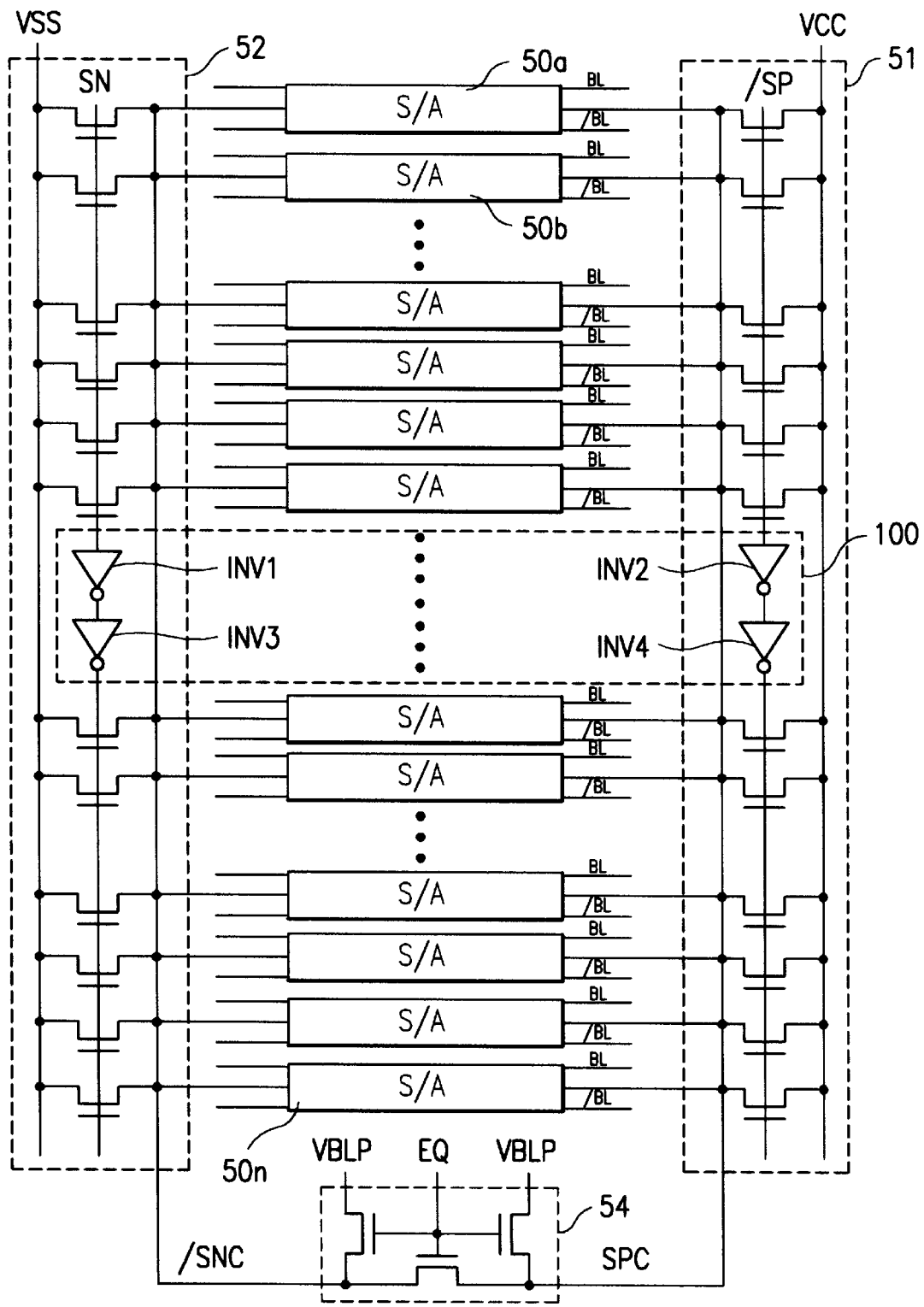
FIG. 6 illustrates a circuit for transmission of a signal for controlling a sense amplifier in accordance with a second embodiment of the present invention.
Figure 7:
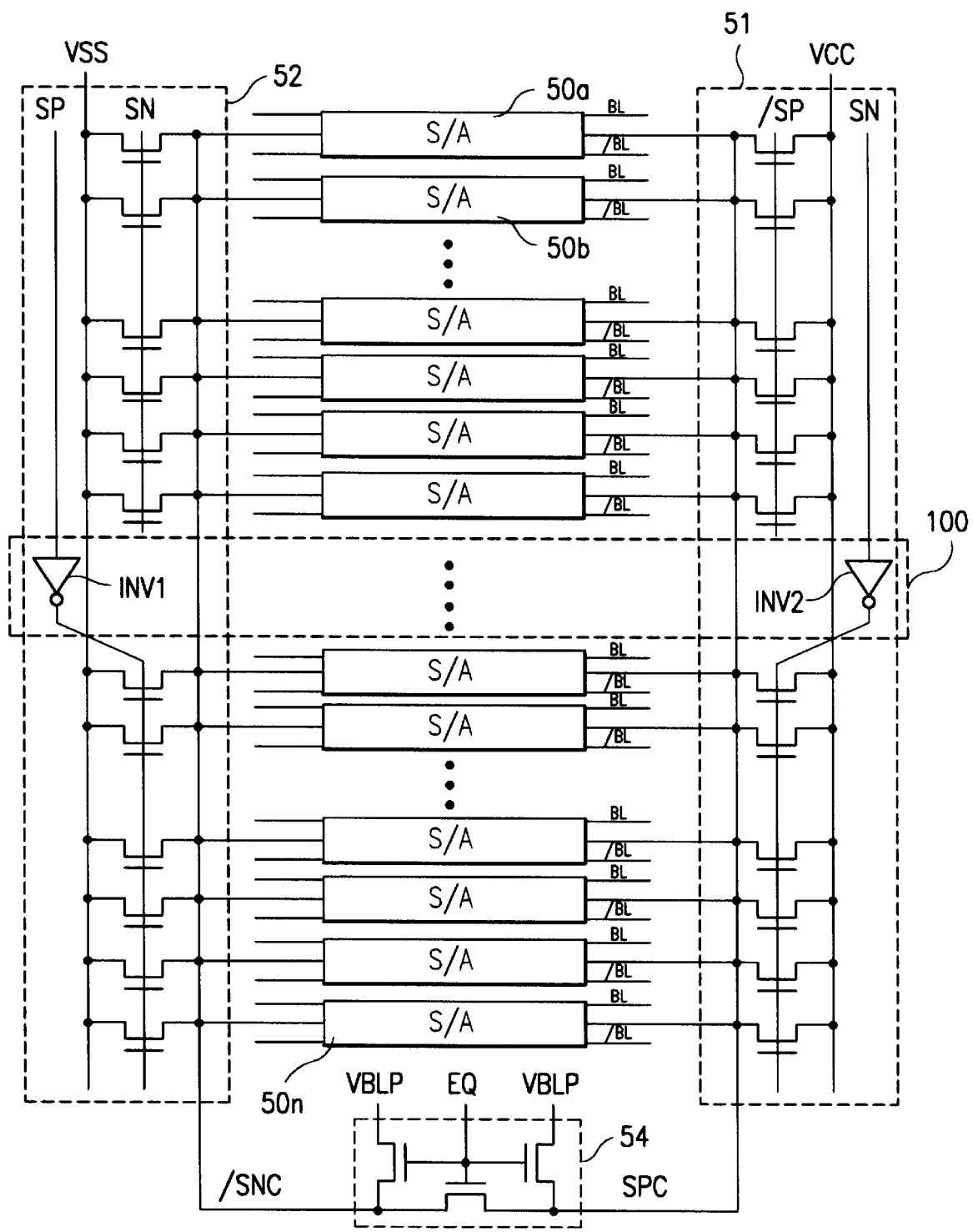
FIG. 7 illustrates a circuit for transmission of a signal for controlling a sense amplifier in accordance with a third embodiment of the present invention; and, FIG. 8 illustrates a circuit for transmission of a signal for controlling a sense amplifier in accordance with a fourth embodiment of the present invention.

FIGS. 6 and 7 illustrate circuits for transmission of a signal for controlling a sense amplifier in accordance with a second and a third embodiment of the present invention. In FIG. 6, a buffer is provided by connecting two inverters (e.g., INV1 and INV3 or INV2 and INV4), in series so that signals /SP and SN for controlling sense amplifiers may be provided without crossing each other. In FIG. 7, signal lines for the /SP and SN signals are separated into at least two sections such that each section is responsible for transmission of a signal up to a designated sense amplifier, such that the crossed structure of the signal lines shown in FIG. 4 is realized outside of the memory cell.

Figure 8:
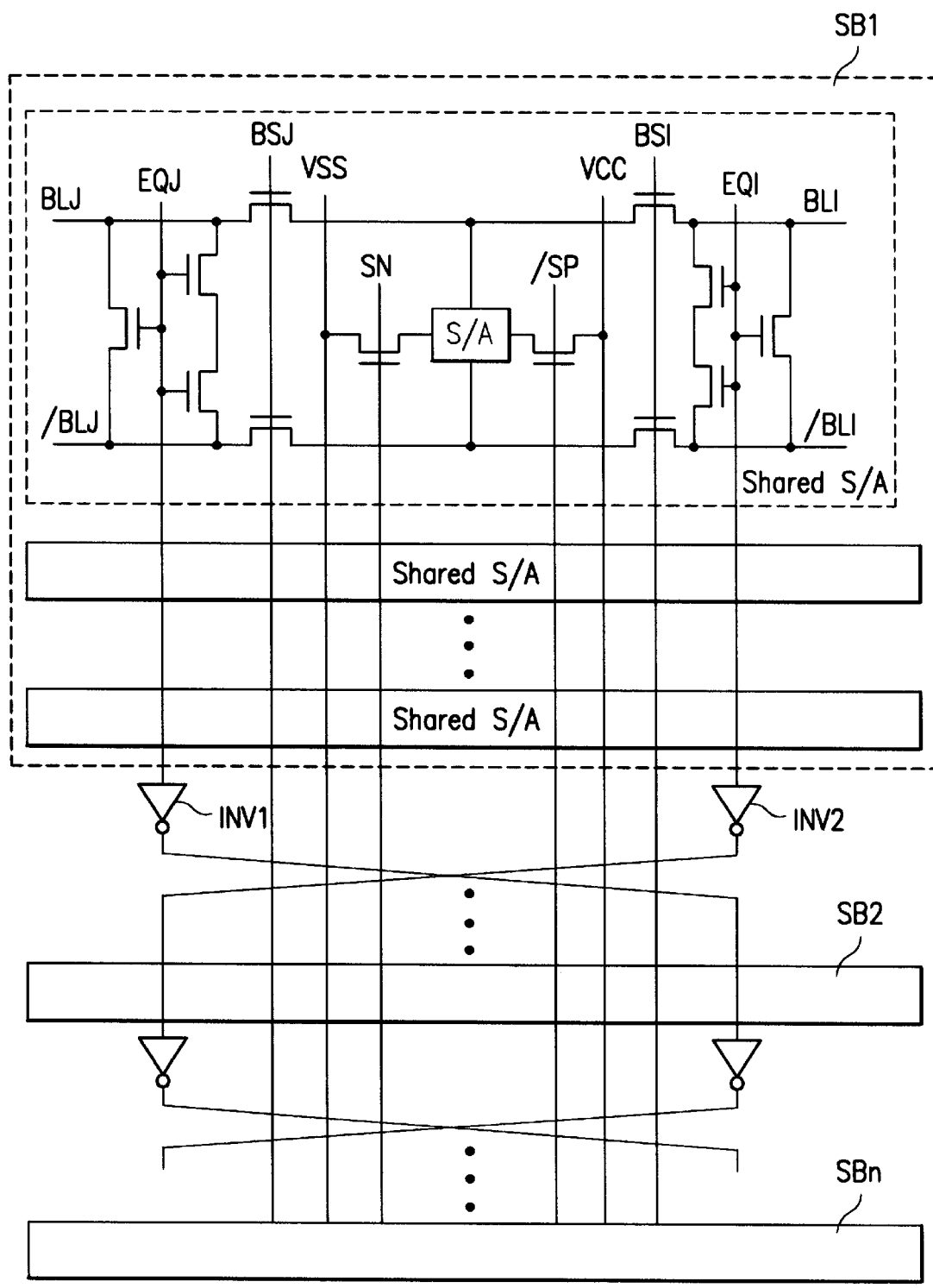

FIG. 8 illustrates a circuit for transmitting a signal for controlling a sense amplifier in accordance with a fourth embodiment of the present invention.

The fourth embodiment sense amplifier of the present invention is a shared sense amplifier in which two pairs of bit lines BLI and /BLI and BLJ and /BLJ share sense amplifiers, wherein the inverters INV1 and INV2 are connected crossing each other at fixed intervals of the sense amplifiers. The inverters INV1 and INV2 may be fitted to every sense amplifier block SB1, SB2, . . . SBn.

The circuit for transmission of a signal for controlling a sense amplifier of the present invention is provided with a sense amplifier driver to every one or every group of a few of sense amplifiers for a faster data sensing of the sense amplifier, allowing restoration of signal delays caused by line loading. Therefore, the circuit for transmission of a signal for controlling a sense amplifier of the present invention can make operation of sense amplifiers faster and more robust.

It will be apparent to those skilled in the art that various modifications and variations can be made in the circuit for controlling a sense amplifier of the present invention without departing from the spirit or scope of the invention. Thus, it is intended that the present invention cover the modifications and variations of this invention provided they come within the scope of the appended claims and their equivalents.

What is claimed is:

1. A circuit for controlling a sense amplifier circuit, comprising:
    a driver signal control circuit for supplying at least one driver signal control signal for controlling at least one driver signal used to drive the sense amplifier circuit; and
    a driver signal compensating circuit for compensating attenuation and delay experienced by the driver signal control signal, and wherein the driver signal compensating circuit includes,
an odd number of inverting amplifiers for amplifying each driver signal, the polarity of the driver signals being inverted by the inverting amplifiers.

2. The circuit of claim 1, wherein the driver signals are supplied by sense amplifier pull-up and pull-down drivers.

3. The circuit of claim 2, wherein the sense amplifier pull-up and pull-down drivers are precharged by a precharge circuit when the sense amplifier is not in operation.

4. The circuit of claim 1, wherein a physical orientation of each driver signal is reversed relative to sense amplifiers within the sense amplifier circuit after being inverted by the inverting amplifiers.

5. A circuit for controlling a sense amplifier circuit, comprising:
a driver signal control circuit for supplying at least one driver signal control signal for controlling at least one driver signal used to drive the sense amplifier circuit; and
a driver signal compensating circuit for compensating attenuation and delay experienced by the driver signal control signal, and wherein the driver signal compensating circuit includes,
an even number of inverting amplifiers for amplifying each driver signal.

6. The circuit of claim 5, wherein the inverting amplifiers include at least two inverting amplifiers connected in series.

7. The circuit of claim 5, wherein the driver signals are supplied by sense amplifier pull-up and pull-down drivers.

8. The circuit of claim 7, wherein the sense amplifier pull-up and pull-down drivers are precharged by a precharge circuit when the sense amplifier is not in operation.

9. A circuit for controlling a sense amplifier circuit, comprising:
a driver signal control circuit for supplying at least one driver signal control signal for controlling at least one driver signal used to drive the sense amplifier circuit; and
a driver signal compensating circuit for compensating attenuation and delay experienced by the driver signal control signal, and wherein the driver signal compensating circuit comprises at least one inverter.

10. The circuit of claim 9, wherein the inverter includes:
a first inverter for receiving a first driver signal control signal from the driver signal control circuit and for generating a second driver signal control signal used to pull-up a next stage of the sense amplifier circuit; and
a second inverter for receiving a third driver signal control signal from the driver signal control circuit and for generating a fourth driver signal control signal used to pull-down the next stage of the sense amplifier circuit.

11. The circuit of claim 9, wherein the driver signals are supplied by sense amplifier pull-up and pull-down drivers.

12. The circuit of claim 11, wherein the sense amplifier pull-up and pull-down drivers are precharged by a precharge circuit when the sense amplifier is not in operation.

13. A circuit for controlling a sense amplifier circuit, comprising:
a driver signal control circuit for supplying at least one driver signal control signal for controlling at least one driver signal used to drive the sense amplifier circuit; and
a driver signal compensating circuit for compensating attenuation and delay experienced by the driver signal control signal, and wherein the driver signal compensating circuit comprises a buffer.

14. The circuit of claim 13, wherein the driver signals are supplied by sense amplifier pull-up and pull-down drivers.

15. The circuit of claim 14, wherein the sense amplifier pull-up and pull-down drivers are precharged by a precharge circuit when the sense amplifier is not in operation.

16. A circuit for controlling a sense amplifier circuit, comprising:
a driver signal control circuit for supplying at least one driver signal control signal for controlling at least one driver signal used to drive the sense amplifier circuit; and
a driver signal compensating circuit for compensating attenuation and delay experienced by the driver signal control signal, and wherein the driver signal control circuit includes at least two signal lines used to supply each of the at least one driver signal control signals, and the driver signal compensating circuit is connected to less than all of the signal lines, thereby compensating driver signals supplied to less than all sense amplifiers of the sense amplifier circuit.

17. The circuit of claim 16, wherein the driver signals are supplied by sense amplifier pull-up and pull-down drivers.

18. The circuit of claim 17, wherein the sense amplifier pull-up and pull-down drivers are precharged by a precharge circuit when the sense amplifier is not in operation.

19. A process for controlling a sense amplifier circuit, comprising:
supplying at least one driver signal control signal for controlling at least one driver signal used to drive the sense amplifier circuit; and
compensating attenuation and delay experienced by the driver signal control signal, and wherein the compensating includes amplifying each driver signal.

20. The process of claim 19, wherein the driver signals are supplied by sense amplifier pull-up and pull-down drivers.

21. The process of claim 20, wherein the sense amplifier pull-up and pull-down drivers are precharged by a precharge circuit when the sense amplifier is not in operation.

22. A process for controlling a sense amplifier circuit, comprising:
supplying at least one driver signal control signal for controlling at least one driver signal used to drive the sense amplifier circuit; and
compensating attenuation and delay experienced by the driver signal control signal, and wherein the compensating includes inverting the polarity of the driver signals.

23. The circuit of claim 22, wherein the compensating further includes:
receiving a first driver signal control signal for pulling-up the next stage of the sense amplifier circuit; and
generating a second driver signal control signal based on the first driver signal control signal, the second driver signal control signal being used to pull-down the next stage of the sense amplifier circuit.

24. The process of claim 22, wherein the compensating further includes:
reversing a physical orientation of each driver signal relative to sense amplifiers within the sense amplifier circuit.

25. The process of claim 22, wherein the compensating further includes:
receiving a first driver signal control signal for pulling-down a next stage of the sense amplifier circuit; and
generating a second driver signal control signal based on the first driver signal control signal, the second driver signal control signal being used to pull-up a next stage of the sense amplifier circuit.

26. The circuit of claim 25, wherein the compensating further includes:
receiving a third driver signal control signal for pulling-up the next stage of the sense amplifier circuit; and
generating a fourth driver signal control signal based on the third driver signal control signal, the fourth driver control signal being used to pull-down the next stage of the sense amplifier circuit.

27. The process of claim 22, wherein the driver signals are supplied by sense amplifier pull-up and pull-down drivers.

28. The process of claim 27, wherein the sense amplifier pull-up and pull-down drivers are precharged by a precharge circuit when the sense amplifier is not in operation.

29. A process for controlling a sense amplifier circuit, comprsing:

supplying at least one driver signal control signal for controlling at least one driver signal used to drive the sense amplifier circuit; and compensating attenuation and delay experienced by the driver signal control signal, and wherein each driver signal is supplied by at least two signal lines, and wherein the compensating includes compensating driver signals supplied to less than all sense amplifiers of the sense amplifier circuit.

30. The process of claim 29, wherein the driver signals are supplied by sense amplifier pull-up and pull-down drivers.

31. The process of claim 30, wherein the sense amplifier pull-up and pull-down drivers are precharged by a precharge circuit when the sense amplifier is not in operation.

* * * * *